United States Patent
Abe et al.

(10) Patent No.: US 10,309,017 B2
(45) Date of Patent: Jun. 4, 2019

(54) LAMINATED HARD FILM AND CUTTING TOOL

(71) Applicant: KOBE STEEL, LTD., Kobe-shi (JP)

(72) Inventors: Maiko Abe, Hyogo (JP); Kenji Yamamoto, Hyogo (JP); Hiroaki Nii, Hyogo (JP)

(73) Assignee: Kobe Steel, Ltd., Kobe-shi (JP)

( * ) Notice: Subject to any disclaimer, the term of this patent is extended or adjusted under 35 U.S.C. 154(b) by 119 days.

(21) Appl. No.: 15/318,612

(22) PCT Filed: Jun. 23, 2015

(86) PCT No.: PCT/JP2015/068106
§ 371 (c)(1),
(2) Date: Dec. 13, 2016

(87) PCT Pub. No.: WO2015/199102
PCT Pub. Date: Dec. 30, 2015

(65) Prior Publication Data
US 2017/0152602 A1    Jun. 1, 2017

(30) Foreign Application Priority Data

Jun. 24, 2014 (JP) ................................ 2014-129122
Apr. 24, 2015 (JP) ................................ 2015-089285

(51) Int. Cl.
| | |
|---|---|
| *B23B 27/14* | (2006.01) |
| *C23C 28/04* | (2006.01) |
| *B23B 51/00* | (2006.01) |
| *B23C 5/16* | (2006.01) |
| *C23C 14/06* | (2006.01) |
| *C04B 41/50* | (2006.01) |
| *C04B 41/52* | (2006.01) |
| *C23C 28/00* | (2006.01) |
| *C23C 30/00* | (2006.01) |

(52) U.S. Cl.
CPC ............ *C23C 28/044* (2013.01); *B23B 27/14* (2013.01); *B23B 51/00* (2013.01); *B23C 5/16* (2013.01); *C04B 41/5024* (2013.01); *C04B 41/5057* (2013.01); *C04B 41/5062* (2013.01); *C04B 41/522* (2013.01); *C23C 14/06* (2013.01); *C23C 28/042* (2013.01); *C23C 28/42* (2013.01); *C23C 28/44* (2013.01); *C23C 30/005* (2013.01)

(58) Field of Classification Search
USPC .......... 51/307, 309; 428/216, 336, 469, 472, 428/697, 698, 699
See application file for complete search history.

(56) References Cited

U.S. PATENT DOCUMENTS

| | | | |
|---|---|---|---|
| 7,258,912 B2 * | 8/2007 | Yamamoto | .......... C23C 14/0036 428/697 |
| 2003/0148145 A1 | 8/2003 | Yamamoto et al. | |
| 2004/0110039 A1 * | 6/2004 | Horling | ............... C23C 14/0641 428/698 |
| 2006/0182999 A1 | 8/2006 | Yamamoto | |
| 2006/0246320 A1 * | 11/2006 | Kathrein | ................. C22C 14/00 428/698 |
| 2008/0318013 A1 | 12/2008 | Yamamoto | |
| 2010/0047545 A1 * | 2/2010 | Yamamoto | .............. C23C 14/06 428/220 |
| 2013/0087604 A1 | 4/2013 | Moriguchi et al. | |

FOREIGN PATENT DOCUMENTS

| | | |
|---|---|---|
| JP | 2003-34859 A | 2/2003 |
| JP | 2006-225703 A | 8/2006 |
| JP | 2008-168365 A | 7/2008 |
| JP | 2010-111952 A | 5/2010 |
| JP | 2012-139696 A | 7/2012 |
| JP | 2012-166320 A | 9/2012 |

OTHER PUBLICATIONS

International Search Report and Written Opinion dated Sep. 1, 2015 in PCT/JP2015/068106 (with English translation).

* cited by examiner

*Primary Examiner* — Archene A Turner
(74) *Attorney, Agent, or Firm* — Oblon, McClelland, Maier & Neustadt, L.L.P.

(57) ABSTRACT

A laminated hard coating comprising a layer A and a layer B, wherein the layer A and the layer B differ in composition and are laminated. Layer A contains $(M_aAl_bCr_cTa_d)(B_xC_yN_z)$ and satisfies $0 \leq a \leq 0.35$, $0.05 \leq d \leq 0.35$, $0 \leq x \leq 0.15$, $0 \leq y \leq 0.50$, $a+b+c+d=1$, and $x+y+z=1$. M is at least one element selected from the group consisting of V, Nb, Mo, and W; a, b, c and d represent the atomic ratios of M, Al, Cr, and Ta, respectively; and x, y, and z represent the atomic ratios of B, C and N, respectively. The layer B comprises $(Ti_\alpha Si_\beta)(B_xC_yN_z)$ and satisfies $0.05 \leq \beta \leq 0.35$, $0 \leq x \leq 0.15$, $0 \leq y \leq 0.50$, $\alpha+\beta=1$, and $x+y+z=1$. $\alpha$ and $\beta$ represent the atomic ratios of Ti and Si, respectively, and x, y, and z represent the atomic ratios of B, C, and N, respectively. One or more layers of each of these layers have been alternately laminated.

16 Claims, No Drawings

LAMINATED HARD FILM AND CUTTING TOOL

TECHNICAL FIELD

The present invention relates to a laminated hard coating exerting excellent wear resistance, and to a cutting tool in which the laminated hard coating has been formed on a substrate surface. More specifically, the present invention relates to a laminated hard coating which is formed on a surface of a cutting tool such as a tip, a drill and an end mill and can enhance the wear resistance of the cutting tool, and to a cutting tool having enhanced wear resistance.

BACKGROUND ART

Conventionally, coating with a hard coating of TiN, TiCN, TiAlN, etc. has been performed for the purpose of enhancing the wear resistance of jig or tool using, as the substrate, a cemented carbide, a cermet, a high-speed tool steel, an alloy tool steel, etc. However, accompanying an increase in the hardness of a work material and a speedup of the cutting rate, realization of a hard coating having increased wear resistance is required.

As the hard coating having more excellent wear resistance than a hard coating of TiN, TiCN, TiAlN, etc., for example, Patent Document 1 has proposed a technique of satisfying a predetermined composition ratio in a hard coating represented by $(M_a,Al_b,[Cr_{1-\alpha}V_\alpha]_c)(C_{1-d}N_d)$ (in which a, b and c represent the atomic ratios of M, Al and Cr+V, respectively, d represents the atomic ratio of N, and $\alpha$ represents the atomic ratio of V), assuming that M is at least one element selected from the group consisting of Ti, Nb, W, Ta, and Mo.

This technique could realize a hard coating more excellent in the wear resistance than a hard coating that has been conventionally used, such as TiN, TiCN and TiAlN, but it is demanded to further improve the wear resistance by maintaining the hardness in a high-temperature environment, i.e., enhancing the stability at a high temperature. In order to increase the wear resistance, the oxidation resistance during high-speed cutting must be enhanced as well. These properties are required also in an environment using a wet lubricant.

PRIOR ART LITERATURE

Patent Document

Patent Document 1: JP-A-2003-34859

SUMMARY OF THE INVENTION

Problems that the Invention is to Solve

The present invention has been made under these circumstances, and an object thereof is to provide a laminated hard coating having more enhanced wear resistance and a cutting tool exhibiting higher wear resistance than ever before by virtue of forming the laminated hard coating on a substrate.

Means for Solving the Problems

The hard coating of the present invention capable of solving the above problems is a laminated hard coating including a layer A and a layer B, the layer A and the layer B differing in composition and being laminated, in which the layer A contains $(M_aAl_bCr_cTa_d)(B_xC_yN_z)$ and satisfies the relationships of $0 \leq a \leq 0.35$, $0.05 \leq d \leq 0.35$, $0 \leq x \leq 0.15$, $0 \leq y \leq 0.50$, $a+b+c+d=1$, and $x+y+z=1$, in which M is at least one element selected from the group consisting of V, Nb, Mo, and W; a, b, c, and d represent the atomic ratios of M, Al, Cr, and Ta, respectively; and x, y and z represent the atomic ratios of B, C and N, respectively, the layer B contains $(Ti_\alpha Si_\beta)(B_xC_yN_z)$ and satisfies the relationships of $0.05 \leq \beta \leq 0.35$, $0 \leq x \leq 0.15$, $0 \leq y \leq 0.50$, $\alpha+\beta=1$, and $x+y+z=1$, in which $\alpha$ and $\beta$ represent the atomic ratios of Ti and Si, respectively; and x, y and z represent the atomic ratios of B, C and N, respectively, and one or more layers of each of these layers have been alternately laminated.

In the hard coating of the present invention, it is preferable that the layer A and the layer B each has a thickness of 1.5 nm or more. It is also a preferable requirement that the layer A and the layer B each has a thickness of 100 nm or less and a lamination number of the layer A and the layer B is plural.

A cutting tool having more excellent wear resistance can be realized by forming the laminated hard coating as described above on a substrate surface. The substrate used for such a cutting tool includes one containing any one of a tungsten carbide-based cemented carbide, a cermet alloy, a high-speed tool steel, and an alloy tool steel.

Advantage of the Invention

According to the present invention, a layer A exhibiting hardness maintenance in a high-temperature environment and a layer B exhibiting high oxidation resistance at a high temperature are laminated to form a laminated hard coating, so that a hard coating having more enhanced wear resistance than the conventional hard coating can be realized.

MODE FOR CARRYING OUT THE INVENTION

The hard coating of the present invention is a laminated hard coating in which one or more layers of each of a layer A exhibiting hardness maintenance in a high-temperature environment and a layer B exhibiting high oxidation resistance at a high temperature have been alternately laminated.

The layer A constituting the laminated hard coating of the present invention is composed of $(M_aAl_bCr_cTa_d)(B_xC_yN_z)$ and satisfies the following relationships:

$$0 \leq a \leq 0.35, \ 0.05 \leq d \leq 0.35,$$

$$0 \leq x \leq 0.15, \ 0 \leq y \leq 0.50,$$

$$a+b+c+d=1, \text{ and } x+y+z=1,$$

in which M is at least one element selected from the group consisting of V, Nb, Mo, and W; a, b, c, and d represent the atomic ratios of M, Al, Cr, and Ta, respectively; and x, y and z represent the atomic ratios of B, C and N, respectively.

The layer A contains a predetermined amount of Ta, whereby stable hardness maintenance can be achieved by suppressing reduction in the hardness in a high-temperature environment. In order to bring out such properties, the atomic ratio of Ta must be 0.05 or more, i.e., $0.05 \leq d$. The value of d is preferably 0.10 or more and more preferably 0.15 or more.

However, if the Ta amount is excessively increased, the oxidation resistance is reduced and therefore, the atomic ratio of Ta must be 0.35 or less, i.e., $d \leq 0.35$. The value of d is preferably 0.30 or less and more preferably 0.25 or less.

M as described above is at least one element selected from the group consisting of V, Nb, Mo, and W. These elements are expected to form an oxide having lubricity during sliding of the cutting tool and exert self-lubricity. However, if the M amount is excessively increased, the oxidation resistance is reduced and therefore, the atomic ratio of M must be 0.35 or less, i.e., a≤0.35. It is preferably 0.30 or less and more preferably 0.25 or less. In order to bring out the above-described effect, the atomic ratio of M is preferably 0.05 or more and more preferably 0.10 or more. Even if M is not contained, the effect of hardness maintenance in a high-temperature environment can be achieved by incorporating a predetermined amount of Ta.

The elements other than M and Ta in the layer A are Al and Cr. These elements are elements necessary for achieving high hardness of the hard coating. The (total) content of these elements may take a value of 0.30≤(b+c)≤0.95 in terms of atomic ratio. Of these elements, the atomic ratio b of Al is preferably 0.5≤b≤0.8. If the atomic ratio b of Al is less than 0.5, the amount of rock-salt-structure type Al N precipitated is decreased, and the effect of increasing hardness is difficult to obtain. The lower limit of the atomic ratio b of Al is more preferably 0.6 or more and still more preferably 0.65 or more. On the other hand, the preferable upper limit of the atomic ratio b of Al is set to 0.8, because if the ratio of Al becomes too large, the content of Cr is relatively decreased and the coating is softened due to precipitation of soft ZnS-type Al N. The upper limit of the atomic ratio b of Al is more preferably 0.77 or less and still more preferably 0.75 or less.

The layer A is fundamentally based on a nitride, i.e., a case where x+y=0 and z=1, but when B or C is added to incorporate boride or carbide partially, i.e., up to 0.5 calculated as the atomic ratio of B or C, the hardness of the hard coating can be further enhanced. In order to bring out such an effect, the atomic ratio of B is preferably 0.01 or more, i.e., 0.01≤x, and more preferably 0.05 or more, i.e., 0.05≤x. The atomic ratio of C is preferably 0.05 or more, i.e., 0.05≤y, and more preferably 0.10 or more, i.e., 0.10≤y.

However, if the added amount of B or C is excessively increased, the hardness of the hard coating is rather reduced. For this reason, the atomic ratio of B must be 0.15 or less, i.e., x≤0.15, and the atomic ratio of C must be 0.50 or less, i.e., y≤0.50. The atomic ratio of B is preferably 0.10 or less, i.e., x≤0.10, and more preferably 0.08 or less, i.e., x≤0.08. The atomic ratio of C is preferably 0.40 or less, i.e., y≤0.40, and more preferably 0.25 or less, i.e., y≤0.25.

On the other hand, the layer B constituting the laminated hard coating of the present invention is composed of $(Ti_\alpha Si_\beta)(B_x C_y N_z)$ and satisfies the following relationships:

$$0.05 \leq \beta \leq 0.35,$$

$$0 \leq x \leq 0.15, 0 \leq y \leq 0.50,$$

$$\alpha+\beta=1, \text{ and } x+y+z=1,$$

in which α and β represent the atomic ratios of Ti and Si, respectively, and x, y and z represent the atomic ratios of B, C and N, respectively.

The layer B contains a predetermined amount of Si in the hard coating containing Ti and exhibiting high oxidation resistance and thereby more enhance the hardness than that of the hard coating containing only Ti. In order to bring out such a property, the atomic ratio of Si must be 0.05 or more, i.e., 0.05≤β. It is preferably 0.10 or more, i.e., 0.10≤β, and more preferably 0.15 or more, i.e., 0.15≤β.

However, if the added amount of Si is excessively increased, the coating is amorphized to rather reduce the hardness. For this reason, the atomic ratio of Si must be 0.35 or less, i.e., β≤0.35. The atomic ratio of Si is preferably 0.30 or less, i.e., β≤0.30, and more preferably 0.25 or less, i.e., β≤0.25.

As with the layer A, the layer B is fundamentally based on a nitride, i.e., a case where x+y=0 and z=1, but when B or C is added to incorporate boride or carbide partially, i.e., up to 0.5 calculated as the atomic ratio of B or C, the hardness of the hard coating can be further enhanced. In order to bring out such an effect, the atomic ratio of B is preferably 0.01 or more, i.e., 0.01≤x, and more preferably 0.05 or more, i.e., 0.05≤x. The atomic ratio of C is preferably 0.05 or more, i.e., 0.05≤y, and more preferably 0.10 or more, i.e., 0.10≤y.

However, if the added amount of B or C is excessively increased, as with the layer A, the hardness of the layer B is rather reduced. For this reason, the atomic ratio of B must be 0.15 or less, i.e., x≤0.15, and the atomic ratio of C must be 0.50 or less, i.e., y≤0.50. The atomic ratio of B is preferably 0.10 or less, i.e., x≤0.10, and more preferably 0.08 or less, i.e., x≤0.08. The atomic ratio of C is preferably 0.40 or less, i.e., y≤0.40, and more preferably 0.25 or less, i.e., y≤0.25.

In the layer A and the layer B, the same subscript is used for the subscripts, i.e., x, y and z, representing the atomic ratios of B, C and N, respectively, but this does not mean that the subscript takes the same value in each of layer A and layer B within the hard coating, and as long as within the range above, even the same subscript may take a different value in each of layer A and layer B.

In order to effectively bring out the functions of the layer A and the layer B, the layers A and B must be present in the state of being laminated independently by alternately laminating one or more layers A and one or more layers B, but not in the state where the compositions of layers A and B are mixed.

In order to effectively bring out the functions of the layer A and the layer B, the thicknesses of the layer A and the layer B are each preferably 1.5 nm or more. The thicknesses are each more preferably 10 nm or more, and each still more preferably 20 nm or more.

For example, in the case where the film thickness of the coating as a whole is 3 μm, i.e., 3,000 nm, the coating having a two-layer structure in which the thickness of each of the layer A and the layer B is 1,500 nm can be obtained. However, in order to bring out the functions of both layers A and B at the maximum in the state of being laminated, the lamination number is preferably plural. From this viewpoint, it is preferred that the thicknesses of the layer A and the layer B are each set to 100 nm or less and the lamination number is set to plural. The thicknesses of the layer A and the layer B are each more preferably 80 nm or less, and each still more preferably 50 nm or less. The lamination number as used herein is a value assuming that lamination of the layer A and the layer B is a lamination number of 1. The film thickness of the coating as a whole is preferably larger, but considering the productivity, it is preferably 5 μm or less and more preferably 4 μm or less. The lamination number is preferably 10 times or more and 2,000 times or less, and more preferably 50 times or more and 1,000 times or less.

The thicknesses of the layer A and the layer B need not be necessarily the same, and, for example, while the thickness of the layer A may be 20 nm, the thickness of the layer B may be from 1.5 to 100 nm. In the coating having a plurality of laminations, the substrate side may be either the layer A or the layer B. The substrate side and the outermost surface side may be layers having the same composition or may be layers having different compositions, and various laminated structures may be adopted according to the purpose.

According to the apparatus and production method described in Examples mentioned later, all layers A or all layers B have the same composition. However, it is also possible to provide a different composition depending on the layer among a plurality of layers A or provide a different composition depending on the layer among a plurality of layers B, by increasing the number of evaporation sources or changing the gas component during deposition. As long as each of layers A and each of the layers B fall in the composition ranges of the present invention, individual compositions may differ from each other.

A cutting tool having more excellent wear resistance can be realized by forming the laminated hard coating as described above on a substrate surface. The substrate used for such a cutting tool includes, for example, a tungsten carbide-based cemented carbide such as WC—Co alloy, WC—TiC—Co alloy, WC—TiC—(TaC or NbC)—Co alloy, and WC—(TaC or NbC)—Co alloy; a cermet alloy such as TiC—Ni—Mo alloy and TiC—TiN—Ni—Mo alloy; a high-speed tool steel such as SKH51 and SKD61 specified in JIS G 4403 :2006; and an alloy tool steel such as SKS11 and SKD I specified in JIS G 4404:2006.

The hard coating can cover a substrate surface by using a known method such as Physical vapor deposition process (PVD process) and Chemical vapor deposition process (CVD process). Of these methods, in view of the adhesiveness, etc. of the hard coating, production by using the PVD process is preferable. Specifically, a reactive PVD process such as sputtering process and ion plating process, for example, an arc ion plating (AIP) process of evaporating or ionizing a target used as a solid evaporation source to deposit on a to-be-treated body (substrate) in a gas atmosphere containing nitrogen, hydrocarbon or boron, is effective. In the case of employing the sputtering process, unbalanced magnetron sputtering (UBMS) in which the irradiation dose of ion to a substrate as the deposition object is large is suitable.

No matter which method for forming the coating is employed, since the component composition of the target used determines the component composition of the coating formed, the component composition of the target is preferably the same as the intended coating composition. In the case of forming a coating containing boride, B may be incorporated into the target without incorporating a boron-containing gas such as $BF_4$ into the atmosphere.

In deposition by an arc ion plating process, preferable conditions include, for example, the following conditions.

Total pressure: 0.5 Pa or more and 4 Pa or less

Applied current (discharge current): 100 to 200 A

Substrate temperature during deposition: 300° C. or more and 800° C. or less

The laminated hard coating of the present invention is useful as a coating formed on a substrate surface of a cutting tool, and considering its excellent wear resistance, a drill for boring work in a wet environment is particularly useful as the cutting tool.

EXAMPLES

The present invention is described more specifically below by referring to Examples, but the present invention is not limited to these Examples and can be of course implemented by appropriately adding changes as long as the gist described above and below is observed, and these changes all are included in the technical scope of the present invention.

Example 1

A coating was formed by laminating a layer A and a layer B each having the composition shown in Table 1 below, by an AIP apparatus having a plurality of evaporation sources. Here, a mirror polished specimen made of cemented carbide of 13 mm×13 mm×5 mm thickness for hardness measurement and a two-flute drill made of cemented carbide with a diameter: 8.5 mm for wear resistance measurement were used as the substrate.

TABLE 1

| Test No. | Composition of Layer A (atomic ratio) | | | | | | | | Composition of Layer B (atomic ratio) | | | | |
|---|---|---|---|---|---|---|---|---|---|---|---|---|---|
| | M | | Al | Cr | Ta | B | C | N | Ti | Si | B | C | N |
| 1 | 0 | — | 0.65 | 0.35 | 0 | 0 | 0 | 1.0 | 0.90 | 0.10 | 0 | 0 | 1.0 |
| 2 | 0 | — | 0.65 | 0.30 | 0.05 | 0 | 0 | 1.0 | 0.90 | 0.10 | 0 | 0 | 1.0 |
| 3 | 0 | — | 0.65 | 0.25 | 0.10 | 0 | 0 | 1.0 | 0.90 | 0.10 | 0 | 0 | 1.0 |
| 4 | 0 | — | 0.65 | 0.20 | 0.15 | 0 | 0 | 1.0 | 0.90 | 0.10 | 0 | 0 | 1.0 |
| 5 | 0 | — | 0.60 | 0.20 | 0.20 | 0 | 0 | 1.0 | 0.90 | 0.10 | 0 | 0 | 1.0 |
| 6 | 0 | — | 0.60 | 0.10 | 0.30 | 0 | 0 | 1.0 | 0.90 | 0.10 | 0 | 0 | 1.0 |
| 7 | 0 | — | 0.55 | 0.10 | 0.35 | 0 | 0 | 1.0 | 0.90 | 0.10 | 0 | 0 | 1.0 |
| 8 | 0 | — | 0.50 | 0.10 | 0.40 | 0 | 0 | 1.0 | 0.90 | 0.10 | 0 | 0 | 1.0 |
| 9 | 0.1 | V | 0.55 | 0.30 | 0.05 | 0 | 0 | 1.0 | 0.90 | 0.10 | 0 | 0 | 1.0 |
| 10 | 0.05 | Nb | 0.60 | 0.30 | 0.05 | 0 | 0 | 1.0 | 0.90 | 0.10 | 0 | 0 | 1.0 |
| 11 | 0.1 | Mo | 0.55 | 0.30 | 0.05 | 0 | 0 | 1.0 | 0.90 | 0.10 | 0 | 0 | 1.0 |
| 12 | 0.05 | W | 0.60 | 0.30 | 0.05 | 0 | 0 | 1.0 | 0.90 | 0.10 | 0 | 0 | 1.0 |
| 13 | 0.1 | V | 0.55 | 0.30 | 0.05 | 0.10 | 0 | 0.90 | 0.90 | 0.10 | 0 | 0 | 1.0 |
| 14 | 0.1 | V | 0.55 | 0.30 | 0.05 | 0.15 | 0 | 0.85 | 0.90 | 0.10 | 0 | 0 | 1.0 |
| 15 | 0.1 | V | 0.55 | 0.30 | 0.05 | 0.20 | 0 | 0.80 | 0.90 | 0.10 | 0 | 0 | 1.0 |
| 16 | 0.1 | V | 0.55 | 0.30 | 0.05 | 0 | 0.25 | 0.75 | 0.90 | 0.10 | 0 | 0 | 1.0 |
| 17 | 0.1 | V | 0.55 | 0.30 | 0.05 | 0 | 0.50 | 0.50 | 0.90 | 0.10 | 0 | 0 | 1.0 |
| 18 | 0.1 | V | 0.55 | 0.30 | 0.05 | 0 | 0.60 | 0.40 | 0.90 | 0.10 | 0 | 0 | 1.0 |
| 19 | 0.1 | Mo | 0.55 | 0.30 | 0.05 | 0 | 0 | 1.0 | 1.0 | 0 | 0 | 0 | 1.0 |
| 20 | 0.1 | Mo | 0.55 | 0.30 | 0.05 | 0 | 0 | 1.0 | 0.95 | 0.05 | 0 | 0 | 1.0 |
| 21 | 0.1 | Mo | 0.55 | 0.30 | 0.05 | 0 | 0 | 1.0 | 0.80 | 0.20 | 0 | 0 | 1.0 |
| 22 | 0.1 | Mo | 0.55 | 0.30 | 0.05 | 0 | 0 | 1.0 | 0.65 | 0.35 | 0 | 0 | 1.0 |
| 23 | 0.1 | Mo | 0.55 | 0.30 | 0.05 | 0 | 0 | 1.0 | 0.60 | 0.40 | 0 | 0 | 1.0 |

TABLE 1-continued

| Test No. | Composition of Layer A (atomic ratio) | | | | | | | Composition of Layer B (atomic ratio) | | | | |
|---|---|---|---|---|---|---|---|---|---|---|---|---|
| | M | | Al | Cr | Ta | B | C | N | Ti | Si | B | C | N |
| 24 | 0 | — | 0.65 | 0.25 | 0.10 | 0 | 0 | 1.0 | 0.80 | 0.20 | 0.15 | 0 | 0.85 |
| 25 | 0 | — | 0.65 | 0.25 | 0.10 | 0 | 0 | 1.0 | 0.80 | 0.20 | 0 | 0.50 | 0.50 |
| 26 | 0.5:0.5 | Ti, Al | 0 | 0 | 0 | 0 | 0 | 1.0 | 0 | 0 | 0 | 0 | 0 |
| 27 | 1.0 | Ti | 0 | 0 | 0 | 0 | 0 | 1.0 | 0 | 0 | 0 | 0 | 0 |
| 28 | 0.05:0.05 | W, Nb | 0.55 | 0.30 | 0.05 | 0 | 0 | 1.0 | 0.90 | 0.10 | 0 | 0 | 1.0 |
| 29 | 0.05:0.05 | Nb, Mo | 0.55 | 0.30 | 0.05 | 0 | 0 | 1.0 | 0.90 | 0.10 | 0 | 0 | 1.0 |
| 30 | 0.05:0.05 | Mo, W | 0.55 | 0.30 | 0.05 | 0 | 0 | 1.0 | 0.90 | 0.10 | 0 | 0 | 1.0 |

Each of these substrates was ultrasonically degreased/cleaned in ethanol and introduced into the AIP apparatus. Evacuation was performed until the pressure inside the apparatus reached $5\times10^{-3}$ Pa. Subsequently, the substrate was heated to 500° C., and etching by Ar ion was conducted for 5 minutes. Thereafter, a nitrogen gas or a hydrocarbon gas was introduced up to 4 Pa, and an arc evaporation source for a target diameter of 100 mm was operated at a discharge current of 150 A to form a coating having a total thickness of about 3 μm, i.e., about 3,000 nm, on the substrate. Here, when incorporating B to form a boride, a target containing B was used.

In the case of forming a laminated hard coating, the targets having compositions of the layer A and the layer B were attached to separate evaporation sources, and a table mounted with the substrate was rotated in the apparatus. First, only the target of layer A was discharged alone for a short time in a nitrogen atmosphere to form a layer of about 100 nm, and the adhesion to the substrate was confirmed. Thereafter, the target of layer B was discharged and while simultaneously discharging the layer A and the layer B, the table was rotated to form a multilayer film in which the thicknesses of the layers A and B are each 20 nm and the lamination number is 75 times. The thickness of the layer A, the thickness of the layer B and the number of laminations in the multilayer film were adjusted by changing the rotational speed of the table. More specifically, when the speed of rotation is raised, the thickness of the layer A and the thickness of the layer B are decreased and the number of laminations is increased, whereas when the speed of rotation is slowed, the thickness of the layer A and the thickness of the layer B are increased and the number of laminations is decreased. As Comparative Examples, a TiAlN single layer as shown in Test No. 26 of Table 1 and a TiN single layer as shown in Test No. 27 of Table 1 were formed.

Each of the hard-coating-covered members obtained was measured for the hardness of hard coating and the wear resistance by the following methods.

(Hardness Measurement)

The Vickers hardness (HV) was measured by using the specimen for hardness measurement under the conditions of a load of 1 N. As a specific standard, ones where the hardness is HV 3400 or more were judged to have sufficient hardness. The hardness is preferably HV 3700 or more and more preferably HV 3800 or more. Since a larger hardness is preferred, the upper limit is not particularly specified, but a too large hardness leads to breakage inside the coating and therefore, the upper limit thereof is preferably HV 4700 or less and more preferably HV 4600 or less.

(Wear Resistance Measurement)

With respect to the wear resistance, a cutting test was performed under the following conditions by using a sample in which the two-flute drill made of cemented carbide had been subjected to a film formation, and the wear resistance was evaluated by measuring the flank wear width on the outer peripheral surface of the drill. As a specific standard, ones where the flank wear width is 69 μm or less were judged to be excellent in the wear resistance. The flank wear width is preferably 64 μm or less, more preferably 59 μm or less, still more preferably 54 μm or less, and yet still more preferably 49 μm or less.

(Cutting Test Conditions)

Work material: SCM440 (low-alloyed structural steel: JIS G 4053:2003, a material in a state before being heat-treated (untreated material))

Cutting speed: 75 m/min

Feed: 0.24 mm/revolution

Depth of cut: 2 mm

Lubrication: external oiling (emulsion)

Evaluation conditions: evaluated by the flank wear width on the outer peripheral surface of the drill after boring of 1,000 holes The results of these are shown together in Test Nos. 1 to 30 of Table 2 below. These are results from examining the effect of the composition ratio on the cutting performance by fixing each of the thicknesses of layers A and B to 20 nm and forming coatings differing in the composition.

TABLE 2

| Test No. | Wear Width of Flank Face (μm) | Hardness (HV) |
|---|---|---|
| 1 | 75 | 3000 |
| 2 | 60 | 3700 |
| 3 | 43 | 3950 |
| 4 | 41 | 4250 |
| 5 | 49 | 4350 |
| 6 | 55 | 4100 |
| 7 | 65 | 4200 |
| 8 | 80 | 4300 |
| 9 | 45 | 3950 |
| 10 | 49 | 4050 |
| 11 | 43 | 4200 |
| 12 | 47 | 4200 |
| 13 | 45 | 4050 |
| 14 | 49 | 4150 |
| 15 | 70 | 3350 |
| 16 | 50 | 3900 |
| 17 | 55 | 3800 |
| 18 | 75 | 3300 |
| 19 | 85 | 2650 |
| 20 | 69 | 4200 |
| 21 | 50 | 4400 |
| 22 | 60 | 4500 |
| 23 | 75 | 2650 |
| 24 | 45 | 3800 |
| 25 | 50 | 3900 |
| 26 | 75 | 2000 |
| 27 | 90 | 1700 |

TABLE 2-continued

| Test No. | Wear Width of Flank Face (μm) | Hardness (HV) |
|---|---|---|
| 28 | 44 | 4100 |
| 29 | 45 | 4100 |
| 30 | 43 | 4200 |

These results lead to the following discussions. It is understood that in Test Nos. 2 to 7, 9 to 14, 16, 17, 20 to 22, 24, 25, and 28 to 30 where the compositions of the layer A and the layer B satisfy the ranges specified in the present invention, good hardness and good wear resistance are exerted.

On the other hand, in Test Nos. 1, 8, 15, 18, 19, 23, 26, and 27 where some of the requirements specified in the present invention are not satisfied, the wear resistance is deteriorated. More specifically, in Test No. 1 that is an example where Ta is not contained in the layer A, the hardness of the layer A is reduced in a high-temperature environment, and the wear resistance of the hard coating is deteriorated. In Test No. 8 that is an example where the Ta content in the layer A is excessively increased, the oxidation resistance of the layer A is reduced, and the wear resistance of the hard coating is deteriorated.

In Test No. 15 that is an example where the content of B in the layer A is excessively increased, the hardness of the coating is less than HV 3400, and the wear resistance is deteriorated. In Test No. 18 that is an example where the content of C is excessively increased, the hardness of the coating is reduced, and the wear resistance is deteriorated.

In Test No. 19 that is an example where the Ti content in the layer B is excessively increased, the Si amount is decreased depending on the increase of B, as a result, the hardness becomes less than HV 3400, and the wear resistance is deteriorated. In Test No. 23 that is an example where the Ti content in the layer B is decreased and at the same time, the Si content is excessively increased, the hardness of the coating is less than HV 3400, and the wear resistance is deteriorated.

In Test No. 26 that is a conventional TiAlN single-layer film, the hardness is lower than that of the hard coating satisfying the requirements specified in the present invention, and the wear resistance is deteriorated. In Test No. 27 that is a conventional TiN film, the hardness is lower than that of the hard coating satisfying the requirements specified in the present invention, and the wear resistance is extremely deteriorated.

Example 2

With respect to the coating having the composition and structure shown in Test No. 4 of Table 1, a hard coating was formed without first forming the layer A of 100 nm and in addition, by changing the thicknesses of the layers A and the layers B and changing the lamination number with every sample and setting the total thickness constant at 3 μm. The production method here was the same as the method described in Example 1. In Test No. 37, the total thickness was set to 3.2 μm, i.e., 3,200 nm.

Each of the hard-coating-covered members obtained was measured for the hardness of hard coating and the wear resistance by the same methods as in Example 1.

The results are shown in Test Nos. 31 to 38 of Table 3 below. Here, Test No. 34 of Table 3 corresponds to Test No. 4 of Tables 1 and 2 except that the layer A of 100 nm was not first formed.

TABLE 3

| Test No. | Thickness of Layer A (nm) | Thickness of Layer B (nm) | Number of Laminations (times) | Wear Width of Flank Face (μm) | Hardness (HV) |
|---|---|---|---|---|---|
| 31 | 1.5 | 1.5 | 1000 | 65 | 4100 |
| 32 | 2.0 | 2.0 | 750 | 60 | 4050 |
| 33 | 10 | 10 | 150 | 45 | 4200 |
| 34 | 20 | 20 | 75 | 41 | 4250 |
| 35 | 50 | 50 | 30 | 45 | 4250 |
| 36 | 100 | 100 | 15 | 55 | 4050 |
| 37 | 200 | 200 | 8 | 58 | 4000 |
| 38 | 1500 | 1500 | 1 | 65 | 3800 |

These results lead to the following discussions. It is understood that in Test Nos. 31 to 38 where the compositions of the layer A and the layer B satisfy the ranges specified in the present invention, good wear resistance is exerted. Among these, in Test Nos. 33 to 35 where the requirement for the more preferable lower limit of the film thickness in the present invention or the requirement for the more preferable upper limit of the film thickness is satisfied, the effect of enhancing the wear resistance was better.

While the present invention has been described in detail and with reference to specific embodiments thereof, it will be apparent to one skilled in the art that various changes and modifications can be made therein without departing from the spirit and scope of the present invention.

The present application is based on a Japanese patent application filed on Jun. 24, 2014 (Application No. 2014-129122) and a Japanese patent application filed on Apr. 24, 2015 (Application No. 2015-089285), the contents thereof being incorporated herein by reference.

INDUSTRIAL APPLICABILITY

The hard coating of the present invention has excellent wear resistance and when the hard coating is formed on a substrate surface of a cutting tool such as a tip, a drill and an end mill, the wear resistance of the cutting tool can be enhanced.

The invention claimed is:

1. A laminated hard coating, comprising, alternately laminated one or more layers A and one or more layers B,
wherein:
each layer A independently comprises $(M_a Al_b Cr_c Ta_d)(B_x C_y N_z)$ and satisfies the relationships of $0 \leq a \leq 0.35, 0.05 \leq d \leq 0.35,$ $0 \leq x \leq 0.15, 0 \leq y \leq 0.50,$ $a+b+c+d=1,$ and $x+y+z=1,$ wherein M is at least one element selected from the group consisting of V, Nb, Mo, and W; a, b, c, and d represent the atomic ratios of M, Al, Cr, and Ta, respectively; and x, y and z represent the atomic ratios of B, C and N, respectively;
each layer B independently comprises $(Ti_\alpha Si_\beta)(B_{x'} C_{y'} N_{z'})$ and satisfies the relationships of $0.05 \leq \beta \leq 0.35,$ $0 \leq x' \leq 0.15, 0 \leq y' \leq 0.50,$ $\alpha+\beta=1,$ and $x'+y'+z'=1,$ wherein α and β represent the atomic ratios of Ti and Si, respectively; and x', y', and z' represent the atomic ratios of B, C and N, respectively; and at least one of the one or more layers B has a thickness of 80 nm or less.

2. The laminated hard coating according to claim 1, wherein each layer A and each layer B have a thickness of 1.5 nm or more.

3. The laminated hard coating according to claim 1, wherein each layer A and each of the remaining layers B, when present, have a thickness of 100 nm or less and a lamination number of the layer A and the layer B is plural.

4. A cutting tool, comprising
the laminated hard coating according to claim 1 formed on a substrate surface.

5. The cutting tool according to claim 4, wherein the substrate comprises a tungsten carbide-based cemented carbide, a cermet alloy, a high-speed tool steel, or an alloy tool steel.

6. The laminated hard coating according to claim 2, wherein each layer A and each of the remaining layers B, when present, have a thickness of 100 nm or less and a lamination number of the layer A and the layer B is plural.

7. A cutting tool, comprising
the laminated hard coating according to claim 2 formed on a substrate surface thereof.

8. A cutting tool, comprising
the laminated hard coating according to claim 3 formed on a substrate surface thereof.

9. A cutting tool, comprising
the laminated hard coating according to claim 6 formed on a substrate surface thereof.

10. The cutting tool according to claim 7, wherein the substrate comprises a tungsten carbide-based cemented carbide, a cermet alloy, a high-speed tool steel, or an alloy tool steel.

11. The cutting tool according to claim 8, wherein the substrate comprises a tungsten carbide-based cemented carbide, a certnet alloy, a high-speed tool steel, or an alloy tool steel.

12. The cutting tool according to claim 9, wherein the substrate comprises a tungsten carbide-based cemented carbide, a cermet alloy, a high-speed tool steel, or an alloy tool steel.

13. A method for enhancing wear resistance of a tool, the method comprising
coating at least a part of a surface of said tool with the laminated hard coating according to claim 1.

14. The method of claim 13, wherein said tool is a tip, a drill, an end mill or a cutting tool.

15. The laminated hard coating according to claim 1, wherein the atomic ratio b of Al satisfies $0.5 \leq b \leq 0.8$.

16. The laminated hard coating according to claim 1, wherein compositions of layers A and B are not mixed.

* * * * *